(12) United States Patent
Talledo

(10) Patent No.: US 11,348,863 B2
(45) Date of Patent: May 31, 2022

(54) SEMICONDUCTOR PACKAGE HAVING A SEMICONDUCTOR DIE ON A PLATED CONDUCTIVE LAYER

(71) Applicant: STMicroelectronics, Inc., Calamba (PH)

(72) Inventor: Jefferson Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 16/706,414

(22) Filed: Dec. 6, 2019

(65) Prior Publication Data

US 2020/0194349 A1 Jun. 18, 2020

Related U.S. Application Data

(60) Provisional application No. 62/778,629, filed on Dec. 12, 2018.

(51) Int. Cl.
*H01L 23/495* (2006.01)
*H01L 23/31* (2006.01)
(Continued)

(52) U.S. Cl.
CPC .... *H01L 23/49541* (2013.01); *H01L 21/4821* (2013.01); *H01L 21/568* (2013.01);
(Continued)

(58) Field of Classification Search
CPC ......... H01L 23/49541; H01L 23/49503; H01L 23/3107; H01L 24/48; H01L 21/4821; H01L 21/568; H01L 24/85; H01L 23/49582; H01L 2224/48177; H01L 24/73; H01L 2224/85001; H01L 2224/83001;
(Continued)

(56) References Cited

U.S. PATENT DOCUMENTS

| 5,939,774 | A | 8/1999 | Yamada | |
|---|---|---|---|---|
| 8,338,962 | B2 * | 12/2012 | Chang | H01L 23/49541 257/777 |
| 8,455,988 | B2 * | 6/2013 | Caparas | H01L 21/4832 257/676 |

(Continued)

FOREIGN PATENT DOCUMENTS

| CN | 105161475 A | 12/2015 |
|---|---|---|
| CN | 108281396 A | 7/2018 |

*Primary Examiner* — Vu A Vu
(74) *Attorney, Agent, or Firm* — Seed Intellectual Property Law Group LLP

(57) ABSTRACT

In various embodiments, the present disclosure provides semiconductor packages, devices, and methods. In one embodiment, a device includes a die pad, leads that are spaced apart from the die pad, and a semiconductor die on the die pad. The semiconductor die has a first surface and a second surface opposite the first surface. The second surface faces the die pad. An encapsulant is provided on the semiconductor die, the die pad and the leads, and the encapsulant has a first surface opposite the die pad and the leads, and a second surface opposite the first surface. The second surface of the encapsulant extends between the die pad and an adjacent lead. The second surface of the encapsulant is spaced apart from the first surface of the encapsulant by a first distance, and an exposed surface of the die pad is spaced apart from the first surface of the encapsulant by a second distance that is greater than the first distance.

19 Claims, 4 Drawing Sheets

(51) Int. Cl.
 *H01L 23/00* (2006.01)
 *H01L 21/48* (2006.01)
 *H01L 21/56* (2006.01)

(52) U.S. Cl.
 CPC .... *H01L 23/3107* (2013.01); *H01L 23/49503* (2013.01); *H01L 23/49582* (2013.01); *H01L 24/48* (2013.01); *H01L 24/85* (2013.01); *H01L 2224/48177* (2013.01)

(58) Field of Classification Search
 CPC ........... H01L 24/83; H01L 2924/00014; H01L 2224/73265; H01L 2224/48091; H01L 2924/181; H01L 2924/18301; H01L 24/32; H01L 2224/32257; H01L 2224/48248; H01L 2224/48471; H01L 23/49548; H01L 21/4832; H01L 23/4952; H01L 23/3121; H01L 2224/85

USPC ....................................................... 257/676
See application file for complete search history.

(56) References Cited

U.S. PATENT DOCUMENTS

| | | | |
|---|---|---|---|
| 8,502,358 B2 * | 8/2013 | Camacho | H01L 21/4842 257/666 |
| 2001/0005599 A1 | 6/2001 | Yamada et al. | |
| 2002/0027265 A1 | 3/2002 | Yoneda et al. | |
| 2007/0215995 A1 | 9/2007 | Lin | |
| 2008/0135990 A1 | 6/2008 | Coyle et al. | |
| 2010/0311208 A1 | 12/2010 | Sirinorakul et al. | |
| 2012/0068333 A1 | 3/2012 | Bindrup et al. | |
| 2012/0133033 A1 | 5/2012 | Camacho et al. | |
| 2013/0313716 A1 | 11/2013 | Mohammed | |
| 2018/0190575 A1 | 7/2018 | Rodriguez et al. | |

* cited by examiner

SEMICONDUCTOR PACKAGE HAVING A SEMICONDUCTOR DIE ON A PLATED CONDUCTIVE LAYER

BACKGROUND

Technical Field

Embodiments of the present disclosure are generally directed to semiconductor packages having a die pad and leads, and methods of forming semiconductor packages.

Description of the Related Art

Semiconductor packages generally include one or more semiconductor electronic components, such as a semiconductor die including one or more integrated circuits (ICs), and a casing to protect the semiconductor die and other internal electronic components. Semiconductor packages come in many forms, including ball grid array (BGA) packages, land grid array (LGA) packages, and quad flat no-lead ("QFN") packages.

QFN packages typically include a lead frame having a back surface of a die pad exposed on a back side of the package. Leads are also exposed on the back side of the package and are spaced apart from and surrounding the die pad. Within the package, the lead frame supports a die in a central position and often includes wire bonds from the die to the leads. A molding compound or sealant is formed over the die, the wires, and the leadframe to complete the package.

Conventional QFN packages are generally limited in terms of thickness, with the thickness of such packages being limited at least in part by the thickness of the lead frame.

BRIEF SUMMARY

In various embodiments, the present disclosure provides semiconductor packages, devices, and methods in which a semiconductor die is positioned on a plated conductive layer and is recessed with respect to a lower, exterior surface of an encapsulation material.

In one embodiment, the present disclosure provides a device includes a die pad, leads that are spaced apart from the die pad, and a semiconductor die on the die pad. The semiconductor die has a first surface and a second surface opposite the first surface. The second surface faces the die pad. An encapsulant is provided on the die pad and the leads, and the encapsulant has a first surface opposite the die pad and the leads, and a second surface opposite the first surface. The second surface of the encapsulant extends between the die pad and an adjacent lead. An exposed surface of the die pad is spaced apart from the first surface of the encapsulant by a first distance, and the second surface of the encapsulant is spaced apart from the first surface of the encapsulant by a second distance that is less than the first distance.

In another embodiment, the present disclosure provides a method that includes: forming plated conductive layers in each of a plurality of cavities of a substrate, the plurality of cavities including a first cavity and a plurality of second cavities spaced laterally apart from a periphery of the first cavity; attaching a semiconductor die to the plated conductive layer in the first cavity; forming wire bonds between the active surface of the semiconductor die and the plated conductive layers in the second cavities; forming an encapsulation layer over the semiconductor die, the wire bonds, and in the plurality of cavities; and forming a die pad and leads by removing the substrate and exposing the plated conductive layers.

In yet another embodiment, the present disclosure provides an electronic device that includes a microprocessor and a semiconductor package electrically coupled to the microprocessor. The semiconductor package includes a die pad, a plurality of leads spaced laterally apart from the die pad, and a semiconductor die on the die pad. The semiconductor die has a first surface and a second surface opposite the first surface. The second surface faces the die pad. An encapsulant is provided on the die pad and the plurality of leads, and the encapsulant has a first surface opposite the die pad and the plurality of leads, and a second surface opposite the first surface. The second surface of the encapsulant extends between the die pad and an adjacent lead of the plurality of leads. An exposed surface of the die pad is spaced apart from the first surface of the encapsulant by a first distance, and the second surface of the encapsulant is spaced apart from the first surface of the encapsulant by a second distance that is less than the first distance.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor dies, lead frames, and semiconductor packaging have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment.

Furthermore, the particular features, structures, or characteristics may be combined in any suitable manner in one or more embodiments of the present disclosure.

As used in the specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

The present disclosure is generally directed to semiconductor packages and methods of forming semiconductor packages in which the overall thickness (or thinness) of the package is not limited by the thickness of the lead frame. More particularly, the present disclosure provides various semiconductor packages and methods in which a lead frame is removed or omitted and a semiconductor die and wire bonds are attached to a conductive plating layer which may be substantially thinner than a lead frame.

Figure 1:
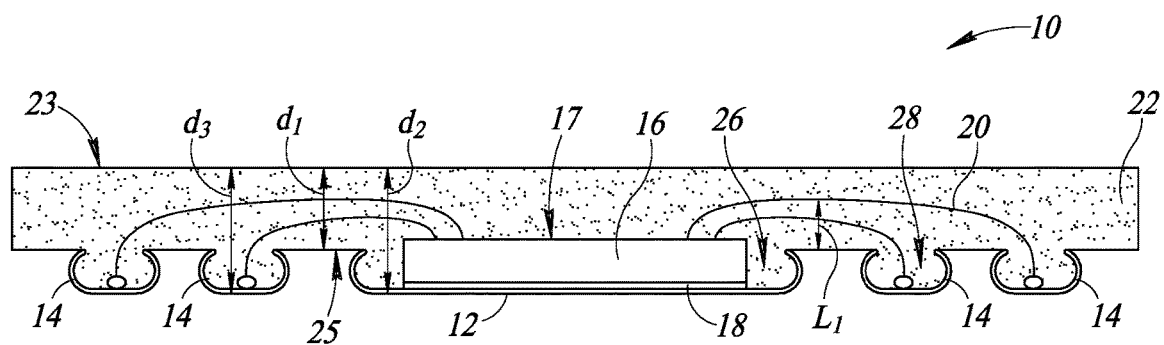
FIG. 1 is a cross-sectional view of a semiconductor package, in accordance with one or more embodiments of the present disclosure.

FIG. 1 is a cross-sectional view illustrating a semiconductor package 10 in accordance with one or more embodiments of the present disclosure. In some embodiments, the package 10 may be a QFN semiconductor package. In some embodiments, the package 10 may be a QFN multi-row (QFN-mr) package having a plurality of rows of exposed leads or lead pads, as shown in FIG. 1.

The package 10 includes a die pad 12 and a plurality of leads 14 that are spaced apart from the die pad 12 in a lateral direction (e.g., in the horizontal direction as shown in FIG. 1). The package 10 may include an array of leads 14 around the die pad 12.

A semiconductor die 16 is positioned on the die pad 12. The semiconductor die 16 may be any semiconductor die including one or more electrical components, such as integrated circuits. The semiconductor die 16 is made from a semiconductor material, such as silicon, and includes an active surface 17 in which integrated circuits are formed. The integrated circuits may be analog or digital circuits implemented as active devices, passive devices, conductive layers, and dielectric layers formed within the semiconductor die 16 and electrically interconnected according to the electrical design and function of the semiconductor die 16.

In some embodiments, the semiconductor die 16 is secured to an inner surface of the die pad 12 by an adhesive material 18. The adhesive material 18 may be any material suitable to mechanically and/or electrically couple the semiconductor die 16 to the die pad 12, such as conductive glue, paste, tape, or the like. In one or more embodiments, the adhesive material 18 may be a die attach film suitable to attach the semiconductor die 16 to the die pad 12.

The semiconductor die 16 is secured to the die pad 12 with the active surface 17 of the semiconductor die 16 facing away from the inner surface of the die pad 12, as shown in FIG. 1.

Conductive wires 20 electrically couple the semiconductor die 16 to the leads 14. For example, the conductive wires 20 may electrically couple respective bond pads on the active surface 17 of the semiconductor die 16 to respective leads 14, and the conductive wires 20 may extend between the active surface 17 of the semiconductor die 16 and inner surfaces of the leads 14.

A layer of encapsulation material 22 is formed over the semiconductor die 16, and covers the semiconductor die 16 and the conductive wires 20. The encapsulation material 22 has a first surface 23 (e.g., an upper surface as shown in FIG. 1) and a second surface 25 (e.g., a lower surface as shown in FIG. 1) that is opposite the first surface 23. The second surface 25 extends between the die pad 12 and leads 14 that are adjacent to the die pad 12, and the second surface 25 may further extend between two or more neighboring leads 14. The second surface 25 may be an exposed surface which forms a part of an exterior of the semiconductor package 10.

As shown in FIG. 1, the die pad 12 and the leads 14 protrude outwardly (e.g., in the downward direction as shown in FIG. 1) beyond the second surface 25 of the encapsulation material 22. The second surface 25 of encapsulation material 22 may be spaced apart from the first surface 23 of the encapsulation material 22 by a first distance ($d_1$), and an exposed surface of the die pad 12 (e.g., an outer surface of the die pad 12) may be spaced apart from the first surface 23 of the encapsulation material 22 by a second distance ($d_2$) that is greater than the first distance ($d_1$).

In some embodiments, exposed surfaces of the leads 14 (e.g., outer surfaces of the leads 14) are spaced apart from the first surface 23 of the encapsulation material 22 by a third distance ($d_3$), and the third distance ($d_3$) is greater than the first distance ($d_1$). In some embodiments, the third distance ($d_3$) is substantially the same as the second distance ($d_2$), and the outermost portions of the leads 14 and the die pad 12 may be substantially coplanar or aligned with one another, as shown in FIG. 1. Accordingly, when the semiconductor package 10 is positioned on another component, such as a printed circuit board or the like, the leads 14 and the die pad 12 may be level with respect to each other, and each of the leads 14 and the die pad 12 may contact regions of the other component, such as corresponding electrical connections on a printed circuit board.

In some embodiments, the second surface 25 of the encapsulation material 22 is an exposed surface which forms a part of an exterior (e.g., part of the bottom surface) of the package 10 along with outer surfaces of the die pad 12 and the leads 14. The encapsulation material 22 may substantially fill any spaces or gaps between the various components in the package 10. As shown in FIG. 1, in some embodiments, the encapsulation material 22 is formed on inner surfaces of the die pad 12 and the leads 14, which protrude outwardly from the second surface 25 of the encapsulation material 22. The encapsulation material 22 may thus fill or substantially fill a protruding die pad region 26, which protrudes outwardly from the second surface 25 of the encapsulation material 22, and may fill or substantially fill a plurality of protruding lead regions 28, which protrude outwardly from the second surface 25 of the encapsulation material 22.

The encapsulation material 22 is an electrically insulating material that protects the semiconductor die 16, conductive wires 20, and any other electrical components or wiring from damage, such as corrosion, physical damage, moisture damage, or other causes of damage to electrical devices and materials. Additionally, the encapsulation material 22 provides structural support to the die pad 12 and the leads 14, since the encapsulation material 22 may be provided in the protruding die pad region 26 and the protruding lead regions 28. In one or more embodiments, the encapsulation material 22 is a molding compound, which may include, for example, a polymer resin.

The exposed bottom or outer surfaces of the leads 14, which may be referred to as lands of the package 10, as well as the exposed bottom or outer surface of the die pad 12, are configured to electrically or mechanically couple the package 10 to external circuitry or to another device or board, such as to an external printed circuit board.

Figure 2A:
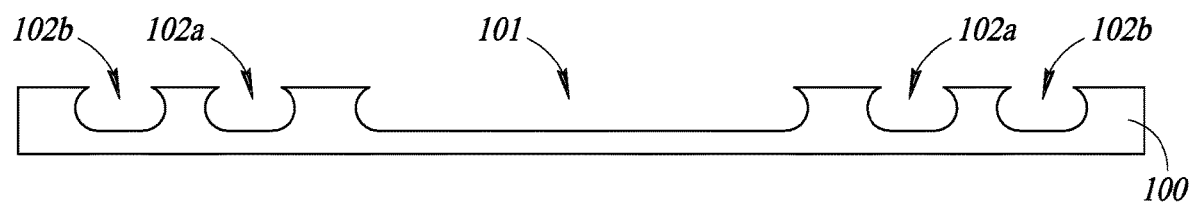
FIG. 2A-2F are cross-sectional views illustrating a method of manufacturing a semiconductor package, such as the semiconductor package shown in FIG. 1, in accordance with one or more embodiments.
Figure 2B:
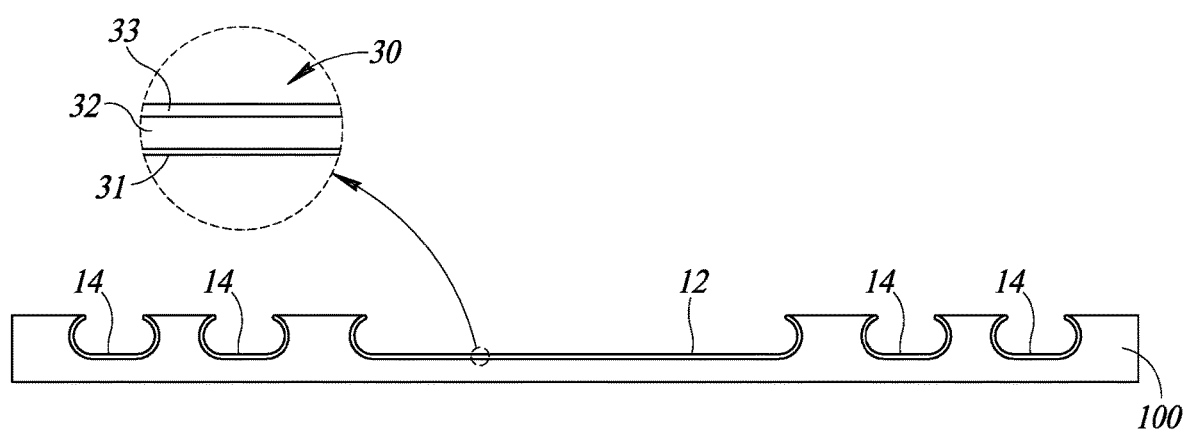

As will be discussed in further detail below, the die pad 12 and the leads 14 may be formed of respective portions of a plated conductive layer 30 (FIG. 2B). In contrast to conventional packages, the package 10 therefore may include a thin plated conductive layer 30 which may serve as the die pad 12 and the leads 14, and an additional substrate, such as a lead frame, may therefore be omitted.

The plated conductive layer 30 may include any electrically and/or thermally conductive material. In some embodiments, the plated conductive layer 30 is formed of an electrically and thermally conductive material.

In some embodiments, the plated conductive layer 30 includes a plurality of metal layers. The plated conductive layer 30 may include a first metal layer 31, a second metal layer 32 on the first metal layer 31, and a third metal layer 33 on the second metal layer 32. The die pad 12 may be positioned on the third metal layer 33, while the first metal layer 31 may form an exposed exterior portion of the semiconductor package 10.

In some embodiments, the first metal layer 31 is a layer of gold, the second metal layer 32 is a layer of nickel, and the third metal layer 33 is a layer of silver.

An overall thickness of the plated conductive layer 30 may be substantially thinner than a conventional lead frame. In some embodiments, the plated conductive layer 30 may have a thickness less than about 50 μm, and in some embodiments, the plated conductive layer 30 may have a thickness less than about 40 μm. In some embodiments, the first metal layer 31 has a thickness less than about 0.5 μm, the second metal layer 32 has a thickness less than about 35 μm, and the third metal layer 33 has a thickness less than about 5 μm.

In some embodiments, portions of the die pad 12 and the leads 14 may be rounded. For example, as shown in FIG. 1, the portions of the die pad 12 and the leads 14, e.g., between the second surface 25 of the encapsulation material 22 and lower surfaces of the die pad 12 and the leads 14, may have rounded cross-sectional profiles. The rounded portions of the die pad 12 and the leads 14 may be formed, for example, by an etching process which will be explained in further detail below. In other embodiments, the die pads 12 and leads 14 may have substantially vertical sidewalls that extend between the second surface 25 of the encapsulation material 22 and lower surfaces of the die pad 12 and the leads 14.

In the semiconductor package 10, a loop height of the conductive wires 20 may be reduced in comparison to conventional semiconductor packages in which a lead frame is included. More particularly, a loop height $L_1$ of a conductive wire 20, as measured between the second surface 25 of the encapsulation material 22 and a highest point of the conductive wire 20, is reduced in comparison to conventional semiconductor packages. This is due at least in part to the leads 14 being recessed (or protruding outward) with respect to the second surface 25 of the encapsulation material 22, which facilitates a reduction in loop height of the conductive wires 20 as compared to conventional semiconductor packages in which conductive wires are connected to inner surfaces of a lead frame which are raised with respect to (or positioned inside of) outer surfaces of the encapsulation material. Moreover, the loop height $L_1$ of the conductive wire 20 may be reduced in part due to the active surface 17 of the semiconductor die 16 being recessed with respect to the second surface 25 of the encapsulation material. As such an overall thickness of the ultimate package is less than standard packages.

FIGS. 2A-2F are cross-sectional views showing various stages of a method of manufacturing semiconductor packages, such as the semiconductor package 10 of FIG. 1, in accordance with one or more embodiments.

As shown in FIG. 2A, a plurality of cavities is formed in a substrate 100. The plurality of cavities includes at least one first cavity 101 and a plurality of second cavities 102 that are spaced laterally apart from a periphery of the first cavity 101. In some embodiments, the second cavities 102 include a plurality of rows of second cavities, with an outer row of second cavities and one or more inner rows of second cavities that are positioned between the first cavity 101 and the outer row of second cavities. For example, as shown in FIG. 2A, the plurality of second cavities 102 includes outer second cavities 102b, each of which may be included in respective outer rows of the second cavities 102, and inner second cavities 102a, each of which may be included in respective inner rows of the second cavities 102.

The substrate 100 may be any suitable substrate in which the first and second cavities 101, 102 may be formed. In some embodiments, the substrate 100 is a metal substrate, such as a lead frame. In some embodiments, the substrate 100 is a copper substrate. In other embodiments, the substrate 100 may be a plastic substrate, a ceramic substrate, or a substrate of any other suitable material in which cavities may be formed.

The plurality of cavities may be formed in the substrate 100 by any suitable techniques, including by one or more of stamping, etching, cutting, laser processing or the like. In some embodiments, the plurality of cavities is formed by removing portions of the substrate 100, for example, by top etching the substrate 100 with a suitable etchant. In some embodiments, for example where the plurality of cavities is formed by top etching the substrate 100, each of the cavities may have rounded inner side surfaces. In other embodiments, the plurality of cavities may have substantially vertical or straight side surfaces that extend between upper and lower surfaces of the substrate 100.

As shown in FIG. 2B, a plated conductive layer 30 is formed in each of the plurality of cavities in the substrate 100. The plated conductive layer 30 may include separate segments in each of the first cavity 101 and second cavities 102, and a segment of the plated conductive layer 30 in the first cavity 101 may form the die pad 12, while segments of the plated conductive layer 30 in the second cavities 102 may form the leads 14.

The plated conductive layer 30 may include any electrically or thermally conductive material. In some embodiments, the plated conductive layer 30 is formed of an electrically and thermally conductive material.

In some embodiments, the plated conductive layer 30 includes a first metal layer 31, a second metal layer 32 on the first metal layer 31, and a third metal layer 33 on the second metal layer 32. In some embodiments, the first metal layer 31 is a layer of gold, the second metal layer 32 is a layer of nickel, and the third metal layer 33 is a layer of silver.

The plated conductive layer 30 may be formed by any suitable technique, including, for example, deposition, electroplating, or the like. In some embodiments, one or more intervening layers may be provided between the inner surfaces of the first and second cavities 101, 102 and the plated conductive layer 30.

In some embodiments, the plated conductive layer 30 may be formed on all upper surfaces of the substrate 100, for example, in the first and second cavities 101, 102, as well as on flat surfaces between the cavities 101, 102. In such embodiments, the portions of the plated conductive layer 30 that extends between neighboring cavities 101, 102 may be removed to electrically isolate each region of the plated conductive layer 30, e.g., the regions of the plated conductive layer 30 within the first cavity 101 and the second cavities 102 may be electrically isolated from one another.

In some embodiments, the plated conductive layer 30 may have a thickness less than about 50 µm, and in some embodiments, the plated conductive layer 30 may have a thickness less than about 40 µm. In some embodiments, the first metal layer 31 has a thickness less than about 0.5 µm, the second metal layer 32 has a thickness less than about 35 µm, and the third metal layer 33 has a thickness less than about 5 µm.

Figure 2C:
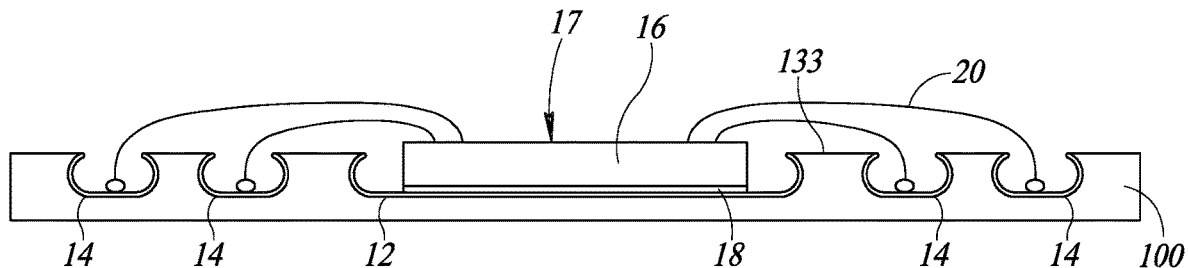

As shown in FIG. 2C, a semiconductor die 16 is attached to the segment of the plated conductive layer 30 in the first cavity 101 (e.g., the segment of the plated conductive layer 30 which forms the die pad 12), and wire bonds or conductive wires 20 are formed between an active surface 17 of the semiconductor die 16 and the plated conductive layer 30 in the plurality of second cavities 102 (e.g., the segments of the plated conductive layer 30 which forms the leads 14).

The semiconductor die 16 may be attached to an inner surface of the die pad 12 by an adhesive material 18. The adhesive material 18 may be any material suitable to mechanically and/or electrically couple the semiconductor die 16 to the die pad 12, such as conductive glue, paste, tape, or the like. In one or more embodiments, the adhesive material 18 is a die attach film suitable to attach the semiconductor die 16 to the die pad 12. The die pad 12 may be positioned on the third metal layer 33 of the plated conductive layer 30, and the first metal layer 31 may be positioned in the cavities of the substrate 100.

Additionally, as shown in FIG. 2C, conductive wires 20 are formed, for example by wire bonding, and couple bond pads on the active surface 17 of the semiconductor die 16 to the leads 14. Since the leads 14 are formed in the second cavities 102, which extend into the substrate 100 from an upper surface 133 of the substrate 100, a loop height of the conductive wires 20 may be reduced in embodiments provided herein as compared to conventional packages.

Figure 2D:
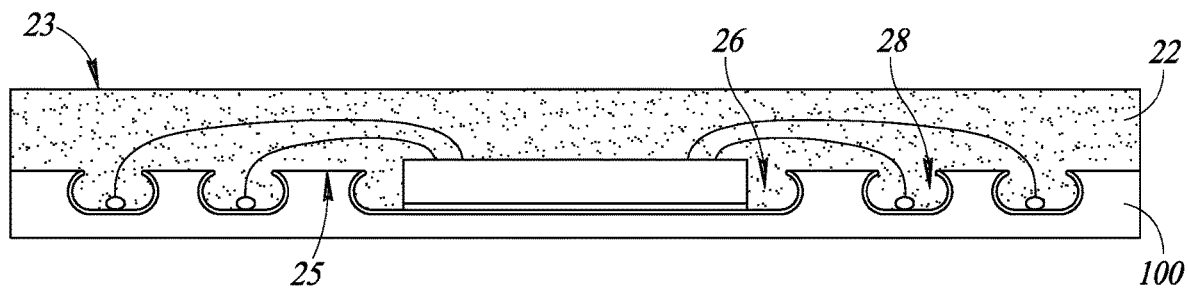

As shown in FIG. 2D, encapsulation material 22 is formed over the semiconductor die 16, and covers the semiconductor die 16 and the conductive wires 20. The encapsulation material 22 has a first surface 23 and a second surface 25 that is opposite the first surface 23. The second surface 25 is formed at an interface between the encapsulation material 22 and the upper surface 133 of the substrate 100, and the second surface 25 of the encapsulation material 22 extends between the die pad 12 and leads 14 that are adjacent to or neighboring the die pad 12, and the second surface 25 may further extend between two or more neighboring leads 14 (e.g., between inner leads 14 and outer leads 14).

Additionally, the encapsulation material 22 is formed in a protruding die pad region 26, which protrudes outwardly from the second surface 25 of the encapsulation material 22, and the encapsulation material 22 is further formed a plurality of protruding lead regions 28, which protrude outwardly from the second surface 25 of the encapsulation material 22. Thus, the encapsulation material 22 may substantially surround side surfaces of the semiconductor die 16 in the first cavity 101, and substantially surrounds the conductive wires 20 in the plurality of second cavities 102.

The encapsulation material 22 may be formed by any conventional techniques, such as by a molding process. For example, the molding process may include positioning the structure shown in FIG. 2C, including the substrate 100, the semiconductor die 16 and the conductive wires 20, into a mold and injecting a molding material, such as a resin molding compound. The molding material is then hardened, which may involve a curing step.

Figure 2E:
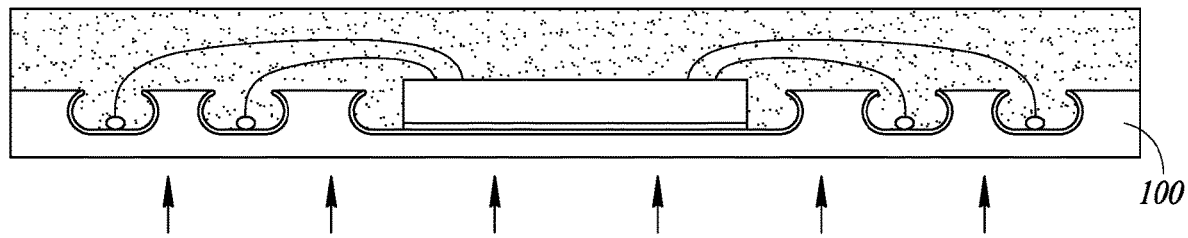

As shown in FIG. 2E, the substrate 100 is removed after the encapsulation material 22 is formed. The substrate 100 may be removed by any suitable technique, including by mechanical separation, cutting, etching, or the like. In some embodiments, the substrate 100 is removed by etching the substrate 100 from a backside of the substrate 100 using any suitable etchant. The etchant may selectively etch away the substrate 100, while retaining the die pad 12, the leads 14, and the encapsulation material 22.

This encapsulation material 22 provides suitable structural support to the die pad 12 and the leads 14 so that the die pad 12 and the leads 14 may generally retain their shape and structure after the substrate 100 has been removed.

Figure 2F:
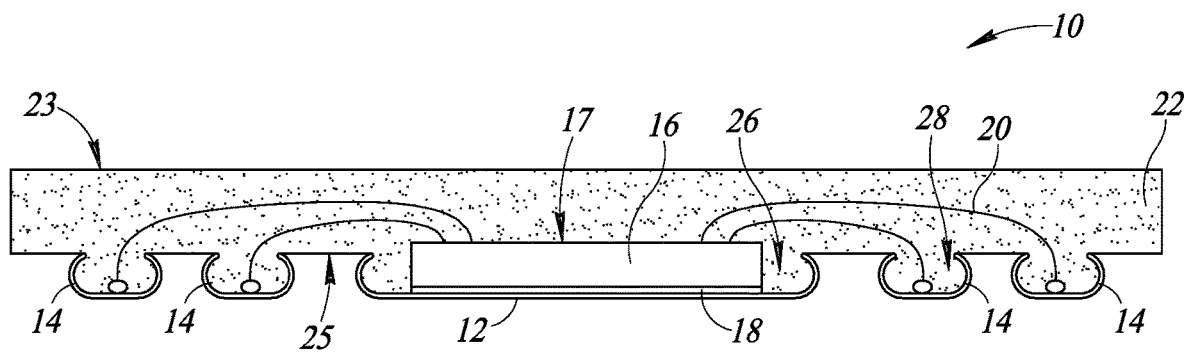

As shown in FIG. 2F, a completed semiconductor package 10 is formed after the substrate has been removed. By removing the substrate, outer surfaces of the die pad 12 and the leads 14 are exposed, and the die pad 12 and leads 14 protrude outwardly beyond the second surface 25 of the encapsulation material 22. The exposed outer surfaces of the leads 14 and the die pad 12, as well as the second surface 25 of the encapsulation material 22, form exterior surfaces of the semiconductor package 10. Additionally, the exposed outer surfaces of the leads 14 and the die pad 12 may be electrically and/or mechanically coupled, for example, to another device or board, such as a printed circuit board.

In some embodiments, more than one semiconductor die may be included in the semiconductor package 10. For example, a plurality of first cavities 101 may be formed in a substrate, and semiconductor dies may be positioned in each of the first cavities 101 (e.g., on a respective die pad 12 formed in each of the first cavities 101). Each of the semiconductor dies may be coupled to one or more of the leads 14 by conductive wires 20. In some embodiments, two or more semiconductor dies may be stacked on each another, for example, in a same first cavity 101.

While the method of manufacturing a semiconductor package shown in FIGS. 2A-2F has been described above as using a substrate 100 which is removed by etching, it should be appreciated that any removable structure may be utilized in place of the substrate 100. In some embodiments, the substrate 100 may be a reusable structure, such that it may be used to form a first semiconductor package, and may be removed and reused to form a plurality of additional semiconductor packages. In some embodiments, a mold of any material may be utilized in place of the substrate 100, and the mold may include a plurality of cavities in which the plated conductive layer 30 is formed.

Figure 3:
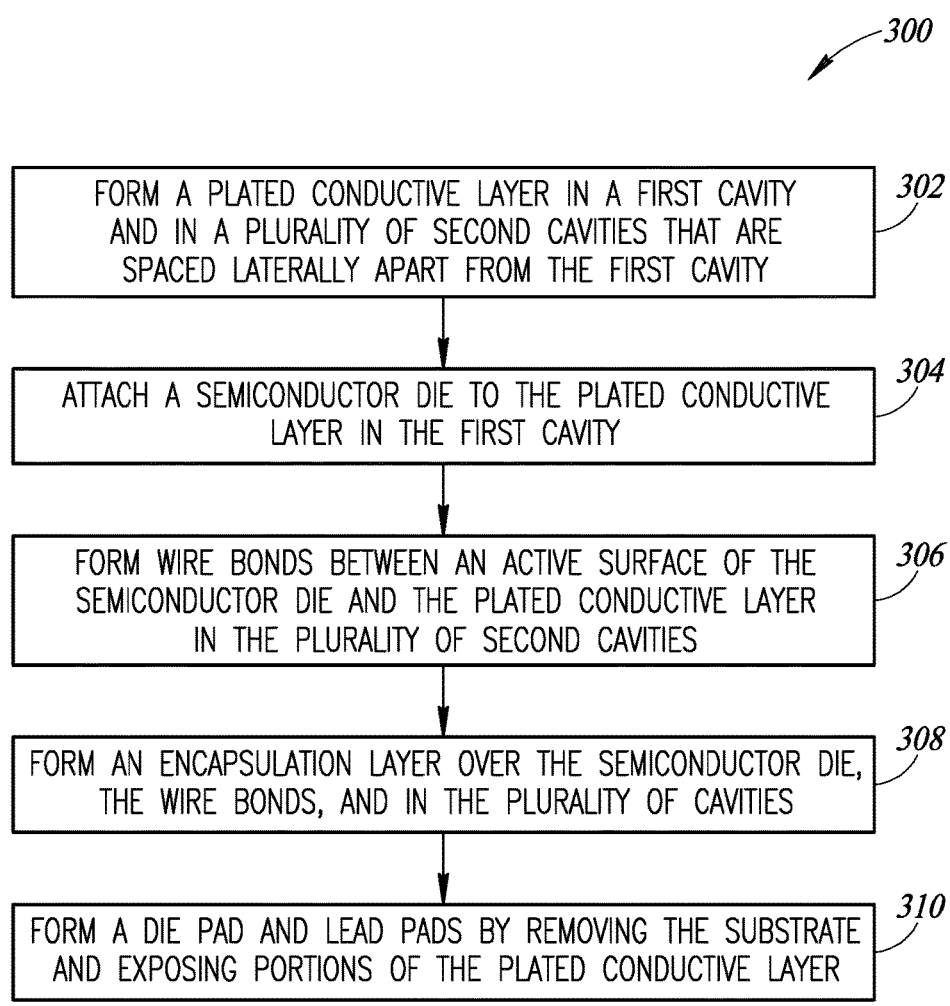
FIG. 3 is a flowchart illustrating a method of manufacturing a semiconductor package, in accordance with one or more embodiments.

FIG. 3 is a flow-chart illustrating a method 300 of manufacturing a semiconductor package, in accordance with one or more embodiments of the present disclosure.

At 302, the method 300 includes forming a plated conductive layer 30 in a first cavity 101 of a structure and in a plurality of second cavities 102 of a structure that are spaced apart from the first cavity 101. The first and second cavities 101, 102 may be formed in any suitable structure, including, for example a substrate such as previously described herein, or in a mold or other reusable structure in which cavities have already been formed. In some embodiments, the method 300 may further include a step of forming the cavities 101, 102 in a substrate.

In some embodiments, one or more intervening layers of materials may be formed between inner surfaces of the cavities 101, 102 and the plated conductive layer 30. Such intervening layers may facilitate removal of the structure or substrate 100 after the various components of the semiconductor package 10 have been formed on the structure or substrate 100.

At 304, the method 300 includes attaching a semiconductor die 16 to the plated conductive layer 30 in the first cavity 101. The semiconductor die 16 may be attached to the plated conductive layer 30, for example, by an adhesive material 18, such as a die attach film or any other suitable material.

At 306, the method 300 includes forming wire bonds or conductive wires 20 between an active surface 17 of the semiconductor die 16 and the plated conductive layer 30 in the plurality of second cavities 102.

At 308, the method 300 includes forming an encapsulation layer, e.g., of an encapsulation material 22, over the semiconductor die 16, the conductive wires 20, and in the plurality of cavities 101, 102.

At 310, the method 300 includes forming a die pad 12 and lead pads or leads 14 by removing the substrate 100 or other structure (e.g., a removable and reusable mold) and exposing portions of the plated conductive layer 30. The exposed portions of the plated conductive layer 30 may form the die pad 12 and leads 14, which are formed, for example, in the first cavity 101 and the second cavities 102, respectively.

In some embodiments, removing the substrate 100 or other structure may include etching the substrate 100 or other structure to expose the portions of the plated conductive layer 30. In other embodiments, the substrate 100 or other structure may be a reusable structure, and the structure may be removed without consuming the structure or otherwise making the structure unfit for repeated use. For example, the structure may be a mold having the cavities 101, 102 preformed within the mold, and the completed semiconductor package 10 may be removed from the mold after the encapsulation material 22 has been formed and hardened on the semiconductor die 16, the conductive wires 20, and in the plurality of cavities 101, 102. Subsequently, one or more additional semiconductor packages may be formed by performing the method 300 again using the same mold or other reusable structure including the plurality of cavities 101, 102.

Figure 4:
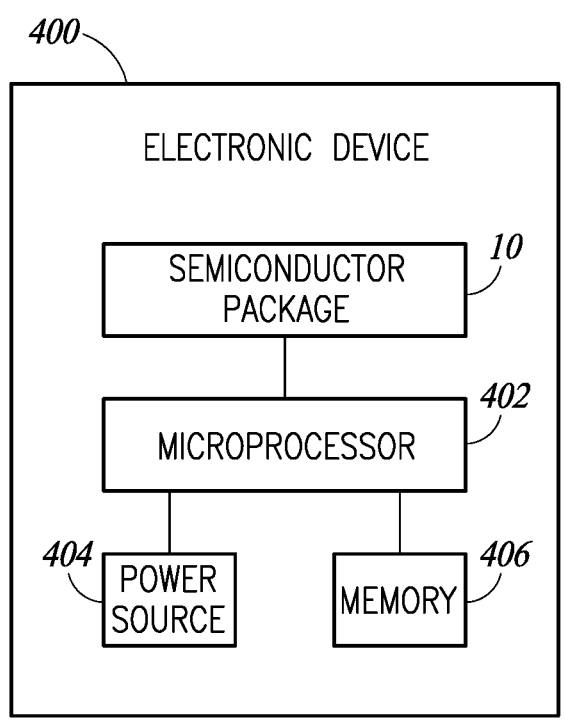
FIG. 4 is a block diagram illustrating an electronic device including a semiconductor package, in accordance with one or more embodiments of the present disclosure.

FIG. 4 shows an electronic device 400 including a semiconductor package described herein, such as the semiconductor package 10. The semiconductor package 10 is electrically coupled to a microprocessor 402. The microprocessor 402 may be any circuit configured to receive or send electrical signals to the semiconductor package 10. The electronic device 400 may further include a power source 404 configured to provide electric power for the device 400. The power source 404, which may be a battery, may be coupled to the microprocessor 402. The electric device 400 may also include a memory 406 coupled to or incorporated in the microprocessor 402.

In one or more embodiments, the electronic device 400 may be a cell phone, smartphone, tablet, camera, and/or wearable computing device that may be located in clothing, shoes, watches, glasses or any other wearable structures. In some embodiments, the electronic device 400, or the semiconductor package 10 itself, may be located in a vehicle, such as boat and car, a robot, or any other moveable structure or machinery.

As has been described with respect to various embodiments of semiconductor packages provided herein, a semiconductor die is positioned on a die pad, which may be a thin plated conductive layer. An encapsulant or encapsulation material is formed on the semiconductor die and on conductive wires that extend from an active surface of the semiconductor die to respective leads that are spaced laterally apart from the die pad. The encapsulant has a lower surface, and the die pad and the leads protrude outwardly (e.g., below) beyond the lower surface of the encapsulant. The semiconductor die may thus be positioned on an inner surface of the die pad, and the semiconductor die may be recessed (e.g., below) with respect to the lower surface of the encapsulant.

Embodiments of the present disclosure provide several advantages over conventional semiconductor packages. For example, semiconductor packages provided by the present disclosure may be substantially thinner than conventional semiconductor packages which include a conventional lead frame. In a conventional semiconductor package having a conventional lead frame, the thickness of the lead frame generally cannot be very thin, as it would become flimsy and may crumple or otherwise cause undesirable handling issues below some minimum thickness. However, the thin plated conductive layer provided in various embodiments of the present disclosure may serve as a die pad and leads and therefore may replace a lead frame. The thin plated conductive layer has a substantially reduced thickness compared to conventional lead frames. Additionally, embodiments of the present disclosure facilitate a reduced loop height of the conductive wires, as the conductive wires may be bonded to leads which are recessed with respect to a lower surface of the encapsulation material. Similarly, the loop height may be reduced with respect to a lower surface of the encapsulation material because the semiconductor die may be positioned on a die pad that is recessed with respect to the lower surface of the encapsulation material, which lowers the level of the semiconductor die.

Further, embodiments of the present disclosure facilitate improved heat dissipation in comparison to conventional semiconductor packages. This is due, at least in part, to the comparatively thin die pad (which is formed of the thin plated conductive layer), which provides a shorter heat transfer path than conventional die pads which are formed from a thicker lead frame. Additionally, the plated conductive layer may be formed of materials which are very good heat conductors, thereby improving heat dissipation from the semiconductor package.

Moreover, the plated conductive layer can reduce or eliminate die pad delamination. More particularly, the plated conductive layer may alleviate undesirable effects of coefficient of thermal expansion (CTE) mismatch between a lead frame material and the semiconductor die. For example, in conventional semiconductor packages, CTE mismatch may cause die pad delamination as the die pad is formed from the lead frame itself and the lead frame may contract or expand at a different rate (e.g., faster) than the semiconductor die. However, in one or more embodiments of the present disclosure, the die pad is replaced or otherwise formed by a portion of the plated conductive layer, and the plated conductive layer may be more compliant than a conventional lead frame. The plated conductive layer has less rigidity than a conventional lead frame, which may be due in part to the reduced thickness of the plated conductive layer, and the plated conductive layer can therefore deform at least partially in response to effects of CTE mismatch, which reduces or eliminates delamination between the semiconductor die and the die pad (e.g., the plated conductive layer).

Similarly, embodiments of the present disclosure can reduce or eliminate lead delamination or disconnection of conductive wires from the leads. This is due, at least in part, to the wire bonding areas being strengthened by the encapsulation material which is provided within the spaces or cavities between the leads and a lower exterior surface of the encapsulation material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a die pad;
leads spaced apart from the die pad;
a semiconductor die on the die pad, the semiconductor die having a first surface and a second surface opposite the first surface, the second surface facing the die pad;
an encapsulant on the semiconductor die, the die pad, and the leads, the encapsulant having a third surface opposite the die pad and the leads, and a fourth surface opposite the third surface, the fourth surface extending between the die pad and one of the leads adjacent to the die pad, wherein a portion of the encapsulant is disposed between a first end of the die pad in contact with the fourth surface of the encapsulant and a bottom portion of the die pad in a vertical direction,
wherein the fourth surface of the encapsulant is spaced apart from the third surface of the encapsulant by a first distance, and an exposed surface of the die pad is spaced apart from the third surface of the encapsulant by a second distance that is greater than the first distance.

2. The device of claim 1, further comprising conductive wires electrically coupled between the semiconductor die and the leads.

3. The device of claim 1 wherein the die pad and the leads include respective portions of a plated conductive layer.

4. The device of claim 3 wherein the plated conductive layer has a thickness that is less than 40 µm.

5. The device of claim 3 wherein the plated conductive layer includes a first metal layer, a second metal layer on the first metal layer, and a third metal layer on the second metal layer, the die pad being positioned on the third metal layer.

6. The device of claim 5 wherein the first metal layer includes gold, the second metal layer includes nickel, and the third metal layer includes silver.

7. The device of claim 6 wherein the first metal layer has a thickness that is less than 0.5 µm, the second metal layer has a thickness that is less than 35 µm, and the third metal layer has a thickness that is less than 5 µm.

8. The device of claim 1 wherein exposed surfaces of the leads are spaced apart from the third surface of the encapsulant by a third distance, the third distance greater than the first distance.

9. The device of claim 8 wherein the third distance is substantially the same as the second distance.

10. The device of claim 1 wherein portions of the die pad and the leads are rounded.

11. The device of claim 1 wherein the encapsulant is an epoxy molding compound.

12. An electronic device, comprising:
a microprocessor; and
a semiconductor package electrically coupled to the microprocessor, the semiconductor package including:
a die pad;
a plurality of leads spaced laterally apart from the die pad;
a semiconductor die on the die pad, the semiconductor die having a first surface and a second surface opposite the first surface, the second surface facing the die pad;
an encapsulant on the die pad and the plurality of leads, the encapsulant having a third surface opposite the die pad and the plurality of leads, and a fourth surface opposite the third surface, the fourth surface extending between the die pad and an adjacent lead of the plurality of leads, wherein a portion of the encapsulant is disposed between a first end of the die pad in contact with the fourth surface of the encapsulant and a bottom portion of the die pad in a vertical direction,
wherein the fourth surface of encapsulant is spaced apart from the third surface of the encapsulant by a first distance, and an exposed surface of the die pad is spaced apart from the third surface of the encapsulant by a second distance that is greater than the first distance.

13. The electronic device of claim 12 wherein the electronic device is at least one of a cell phone, a smartphone, a tablet computer device, a camera, a wearable computing device, a vehicle, or a robotic machine.

14. A device, comprising:
a die pad;
a semiconductor die having a first surface on the die pad and a second surface opposite the first surface;
a first lead spaced laterally apart from and adjacent to a first side of the die pad;
a second lead spaced laterally apart from and adjacent to a second side of the die pad, the second side opposite the first side; and
an encapsulant on the semiconductor die, the die pad, and the first and second leads, the encapsulant having a third surface extending laterally between an end of the die pad and an end of the first lead and a fourth surface extending laterally between a second end of the die pad and an end of the second lead, wherein a portion of the encapsulant is disposed between a first end of the die pad in contact with the fourth surface of the encapsulant and a bottom portion of the die pad in a vertical direction,
wherein the first lead, the second lead, the die pad, and at least a portion of the semiconductor die protrude outwardly beyond the third and fourth surfaces of the encapsulant.

15. The device of claim 14 wherein the die pad and the first and second leads include respective portions of a plated conductive layer.

16. The device of claim 15 wherein the plated conductive layer has a thickness that is less than 40 µm.

17. The device of claim 15 wherein the third and fourth surfaces of the encapsulant are substantially coplanar with respect to one another.

18. The device of claim 15 wherein the first and second leads extend outwardly beyond the die pad.

19. The device of claim 15 wherein portions of the die pad and the leads are rounded.

* * * * *